US012683202B2

(12) United States Patent
Kwon et al.

(10) Patent No.: US 12,683,202 B2
(45) Date of Patent: Jul. 14, 2026

(54) APPARATUS AND METHOD FOR DIAGNOSING FAULT FOR LITHIUM-AIR BATTERY BASED POWER SUPPLY DEVICE

(71) Applicants:HYUNDAI MOTOR COMPANY, Seoul (KR); KIA CORPORATION, Seoul (KR); SEOUL NATIONAL UNIVERSITY R&DB FOUNDATION, Seoul (KR)

(72) Inventors: Hoimin Kwon, Suwon-si (KR); Youngsuk Cho, Sejong-si (KR); Suhyun Kim, Seoul (KR); Kyounghan Ryu, Yongin-si (KR); Yeongho Lee, Seoul (KR); Jinyoung Park, Incheon (KR); Yooil Lee, Anyang-si (KR); Minsoo Kim, Seoul (KR)

(73) Assignees: HYUNDAI MOTOR COMPANY, Seoul (KR); KIA CORPORATION, Seoul (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 531 days.

(21) Appl. No.: 18/332,216

(22) Filed: Jun. 9, 2023

(65) Prior Publication Data

US 2024/0204269 A1 Jun. 20, 2024

(30) Foreign Application Priority Data

Dec. 16, 2022 (KR) ......................... 10-2022-0176592

(51) Int. Cl.
*H01M 10/42* (2006.01)
*G01R 31/36* (2020.01)
(Continued)

(52) U.S. Cl.
CPC .... *H01M 10/4285* (2013.01); *G01R 31/3644* (2013.01); *G01R 31/367* (2019.01); *G01R 31/378* (2019.01); *H01M 12/08* (2013.01)

(58) Field of Classification Search
None
See application file for complete search history.

(56) References Cited

U.S. PATENT DOCUMENTS 5,566,273 A * 10/1996 Huang .............. G06F 18/23211
706/28
2017/0012333 A1* 1/2017 Kwon ................. H01M 8/0432
(Continued)

FOREIGN PATENT DOCUMENTS

CN 110123244 A 8/2019
CN 105686786 B 11/2019
(Continued)

*Primary Examiner* — Raymond L Nimox
(74) *Attorney, Agent, or Firm* — MCDONNELL BOEHNEN HULBERT & BERGHOFF LLP

(57) ABSTRACT

An apparatus for diagnosing a fault for a lithium-air battery based power supply device includes a data collection part configured to collect data by measuring operational state changes occurring in the power supply device components for each type of fault, a training part configured to train a neural network model using the collected data to classify the type of fault, and a fault diagnosis part configured to diagnose the type of fault by inputting residual changes of each component during operation of the power supply device as input values for the trained neural network model.

12 Claims, 8 Drawing Sheets

(51) Int. Cl.
  *G01R 31/367*       (2019.01)
  *G01R 31/378*       (2019.01)
  *H01M 12/08*        (2006.01)

(56)              References Cited

U.S. PATENT DOCUMENTS

| | | | |
|---|---|---|---|
| 2022/0114467 A1* | 4/2022 | Chang ..................... | C02F 1/008 |
| 2022/0313061 A1 | 10/2022 | Kim et al. | |
| 2024/0142535 A1* | 5/2024 | Jeong ................. | G01R 31/3835 |

FOREIGN PATENT DOCUMENTS

| | | | |
|---|---|---|---|
| KR | 20-0394564 Y1 | 9/2005 | |
| KR | 20-0425562 Y1 | 9/2006 | |
| KR | 10-0934977 B1 | 1/2010 | |
| KR | 2010-0106162 A | 10/2010 | |
| KR | 2010-0113680 A | 10/2010 | |
| KR | 10-1174227 B1 | 8/2012 | |
| KR | 2013-0030717 A | 3/2013 | |
| KR | 2013-0004718 U | 8/2013 | |
| KR | 10-1335362 B1 | 12/2013 | |
| KR | 2013-0131958 A | 12/2013 | |
| KR | 2016-0034684 A | 3/2016 | |
| KR | 2017-0054022 A | 5/2017 | |
| KR | 10-1765858 B1 | 8/2017 | |
| KR | 10-1769806 B1 | 8/2017 | |
| KR | 10-2057418 B1 | 12/2019 | |
| KR | 2021-0085188 A | 7/2021 | |

* cited by examiner

FIG. 7

| Normal | Fault_1 | Fault_2 | Fault_3 | Fault_4 |
|--------|---------|---------|---------|---------|
| 1 | -1 | -1 | -1 | -1 |
| -1 | 1 | -1 | -1 | -1 |
| -1 | -1 | 1 | -1 | -1 |
| -1 | -1 | -1 | 1 | -1 |
| -1 | -1 | -1 | -1 | 1 |

Figure 8:
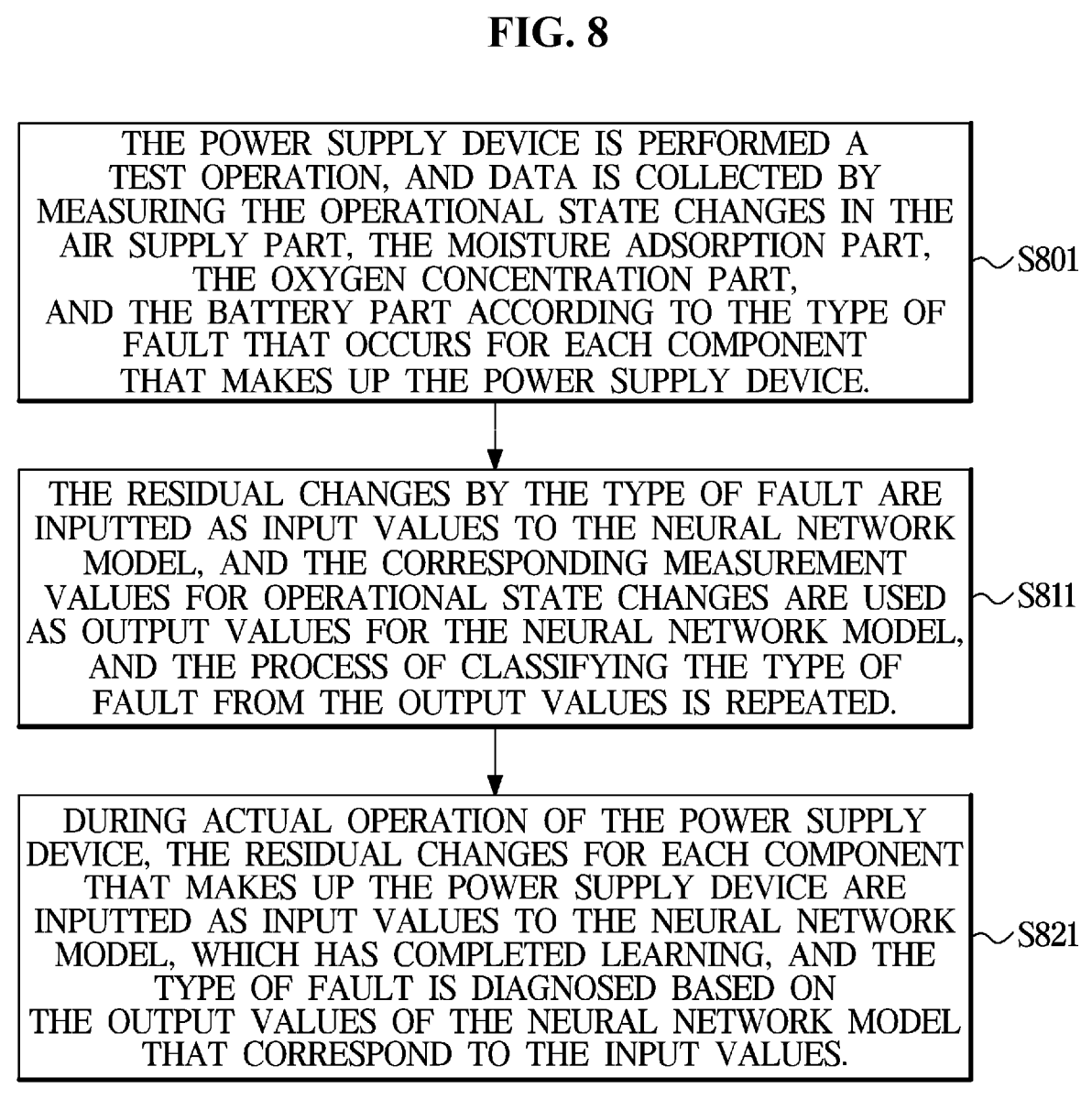

THE POWER SUPPLY DEVICE IS PERFORMED A
TEST OPERATION, AND DATA IS COLLECTED BY
MEASURING THE OPERATIONAL STATE CHANGES IN THE
AIR SUPPLY PART, THE MOISTURE ADSORPTION PART,
THE OXYGEN CONCENTRATION PART,
AND THE BATTERY PART ACCORDING TO THE TYPE OF
FAULT THAT OCCURS FOR EACH COMPONENT
THAT MAKES UP THE POWER SUPPLY DEVICE.

~S801

THE RESIDUAL CHANGES BY THE TYPE OF FAULT ARE
INPUTTED AS INPUT VALUES TO THE NEURAL NETWORK
MODEL, AND THE CORRESPONDING MEASUREMENT
VALUES FOR OPERATIONAL STATE CHANGES ARE USED
AS OUTPUT VALUES FOR THE NEURAL NETWORK MODEL,
AND THE PROCESS OF CLASSIFYING THE TYPE OF
FAULT FROM THE OUTPUT VALUES IS REPEATED.

~S811

DURING ACTUAL OPERATION OF THE POWER SUPPLY
DEVICE, THE RESIDUAL CHANGES FOR EACH COMPONENT
THAT MAKES UP THE POWER SUPPLY DEVICE ARE
INPUTTED AS INPUT VALUES TO THE NEURAL NETWORK
MODEL, WHICH HAS COMPLETED LEARNING, AND THE
TYPE OF FAULT IS DIAGNOSED BASED ON
THE OUTPUT VALUES OF THE NEURAL NETWORK MODEL
THAT CORRESPOND TO THE INPUT VALUES.

~S821

APPARATUS AND METHOD FOR DIAGNOSING FAULT FOR LITHIUM-AIR BATTERY BASED POWER SUPPLY DEVICE

CROSS REFERENCE TO RELATED APPLICATIONS

This application claims the benefit of Korean Patent Application No. 10-2022-0176592, filed on Dec. 16, 2022, which application is hereby incorporated herein by reference.

TECHNICAL FIELD

The disclosure relates to an apparatus and method for diagnosing a fault of a lithium-air battery based power supply device.

BACKGROUND

As evidenced by the UN Climate Change Convention and the EU Taxonomy, there is a rapid global transition towards environmentally friendly energy. Additionally, with stricter regulations on fuel efficiency and emissions, the demand for eco-friendly mobility devices utilizing electric energy continues to increase.

The commercialization of high-performance batteries with high energy density is required for the development of the eco-friendly mobility industry utilizing electric energy. Lithium-air batteries have a significantly higher energy density compared to lithium-ion batteries. Due to the high energy density, lithium-air batteries are gaining attention as the next-generation battery.

To apply lithium-air batteries to eco-friendly mobility devices, it is required to improve the stability and extend the lifespan, as well as optimizing existing humidity control systems (adsorption systems) and oxygen concentration systems to be suitable for lithium-air batteries.

In addition, if problems occur with parts related to lithium-air batteries, it can lead to a rapid decline in battery life. Therefore, there is a need to efficiently diagnose the deterioration and fault of parts, as well as the types of faults.

SUMMARY

An aspect of the disclosure is to provide an apparatus and method for diagnosing a fault of a lithium-air battery based power supply device that are capable of effectively diagnosing an occurrence of a fault and the type of the fault using a neural network.

According to an aspect of the disclosure, there is provided an apparatus for diagnosing a fault of a lithium-air battery based power supply device including: a data collection part configured to perform a test operation on a lithium-air battery based power supply device which includes an air supply part including an air pump for suctioning external air, a moisture adsorption part for absorbing moisture in the air supplied from the air pump, an oxygen concentration part for concentrating oxygen in the air supplied through the moisture adsorption part, and a battery part for receiving the concentrated oxygen from the oxygen concentration part at a time of discharge, and in response to a fault occurring in the air supply part, the moisture adsorption part, the oxygen concentration part, and the battery part, measure operational state changes of the air supply part, the moisture adsorption part, the oxygen concentration part, and the battery part according to the types of the fault, to collect data; a training part configured to train a neural network model by repeating a process of inputting residual changes according to the types of the fault into a neural network model as input values and classifying the types of the fault based on output values of the neural network model which are measurements of the operational state changes corresponding to the input values; and a fault diagnosis part configured to, during an actual operation of the lithium-air battery based power supply device, input residual changes of the air supply part, the moisture adsorption part, the oxygen concentration part, and the battery part as input values for the trained neural network model, and diagnose a type of a fault based on output values output in response to the input values of the neural network model.

The data collection part may comprise a first sensor part for detecting a fault of a solenoid valve provided in at least one of (i) an air route connecting the air pump to the moisture absorption part, (ii) an air route connecting the moisture absorption part to the oxygen concentration part, (iii) an air route connecting the oxygen concentration part to a vacuum pump discharging air of the oxygen concentration part to an outside, and (iv) an air route connecting the oxygen concentration part to the battery part, wherein the data collection part is configured to collect data obtained by measuring the operational state changes occurring in the air supply part, the moisture absorption part, the oxygen concentration part, and the battery part in response to a fault being detected by the first sensor part.

The data collection part further may comprise a second sensor part for detecting a fault of at least one of (i) the air pump, a first adsorption dehumidifier and a second adsorption dehumidifier included in the moisture absorption part, (ii) a heating part for individually heating the first adsorption dehumidifier and the second adsorption dehumidifier, (iii) a first oxygen concentrator and a second oxygen concentrator included in the oxygen concentration part, (iv) the vacuum pump, (v) a lithium-air battery included in the battery part, and (vi) a pressure regulator for regulating an internal pressure of the battery part, wherein the data collection part is configured to collect data obtained by measuring the operational state changes occurring in the air supply part, the moisture absorption part, the oxygen concentration part, and the battery part in response to a fault being detected by the second sensor.

The training part may represent the residual changes using normalized data values between 0 and 1.

The training part may represent the output values of the neural network model as a unique pattern of matrix values according to the type of the fault.

The fault diagnosis part may adjust a threshold value used for determining an occurrence of a fault based on the output values of the neural network model such that a minor fault having an insignificant impact on the operation of the lithium-air battery based power supply device is treated as normal.

According to another aspect of the disclosure, there is provided a method for diagnosing a fault of a lithium-air battery based power supply device including: performing a test operation on a lithium-air battery based power supply device which includes an air supply part including an air pump for suctioning external air, a moisture adsorption part for absorbing moisture in the air supplied from the air pump, an oxygen concentration part for concentrating oxygen in the air supplied through the moisture adsorption part, and a battery part for receiving the concentrated oxygen from the oxygen concentration part at a time of discharge; collecting data, in response to a fault occurring in the air supply part, the moisture adsorption part, the oxygen concentration part, and the battery part, by measuring operational state changes of the air supply part, the moisture adsorption part, the oxygen concentration part, and the battery part according to the types of the fault; training a neural network model by repeating a process of inputting residual changes according to the types of the fault into a neural network model as input values and classifying the types of the fault based on output values of the neural network model which are measurements of the operational state changes corresponding to the input values; inputting residual changes of the air supply part, the moisture adsorption part, the oxygen concentration part, and the battery part, during an actual operation of the lithium-air battery based power supply device, as input values for the trained neural network model during an actual operation of the lithium-air battery based power supply device; and diagnosing a type of a fault based on output values output in response to the input values of the neural network model.

The collecting data may comprise detecting, by a first sensor, a fault of at least one of solenoid valves respectively provided in an air route connecting the air pump to the moisture absorption part, an air route connecting the moisture absorption part to the oxygen concentration part, an air route connecting the oxygen concentration part to a vacuum pump discharging air of the oxygen concentration part to an outside, and an air route connecting the oxygen concentration part to the battery part; and measuring the operational state changes occurring in the air supply part, the moisture absorption part, the oxygen concentration part, and the battery part in response to the fault detected by the first sensor.

The collecting data further may comprise detecting, by a second sensor, a fault of at least one of the air pump, a first adsorption dehumidifier and a second adsorption dehumidifier included in the moisture absorption part, a heating part for individually heating the first adsorption dehumidifier and the second adsorption dehumidifier, a first oxygen concentrator and a second oxygen concentrator included in the oxygen concentration part, the vacuum pump, a lithium-air battery included in the battery part, and a pressure regulator for regulating an internal pressure of the battery part; and measuring the operational state changes occurring in the air supply part, the moisture absorption part, the oxygen concentration part, and the battery part in response to the fault detected by the second sensor.

The training the neural network model may comprise representing the residual changes using normalized data values between 0 and 1.

The training the neural network model may comprise representing the output values of the neural network model as a unique pattern of matrix values according to the type of the fault.

The diagnosing the type of fault may comprise adjusting a threshold value used for determining an occurrence of a fault based on the output values of the neural network model such that a minor fault having an insignificant impact on the operation of the lithium-air battery based power supply device is treated as normal.

BRIEF DESCRIPTION OF THE FIGURES

These and/or other aspects of the disclosure will become apparent and more readily appreciated from the following description of the embodiments, taken in conjunction with the accompanying drawings of which:

FIG. 7 is a view for illustrating the representation of the output values in the form of unique patterns of matrix values in response to the input values of the neural network model shown in FIG. 5.

FIG. 8 is a flowchart illustrating a method of diagnosing a fault of a lithium-air battery based power supply device using the apparatus for diagnosing a fault shown in FIG. 4.

DETAILED DESCRIPTION

Figure 1:
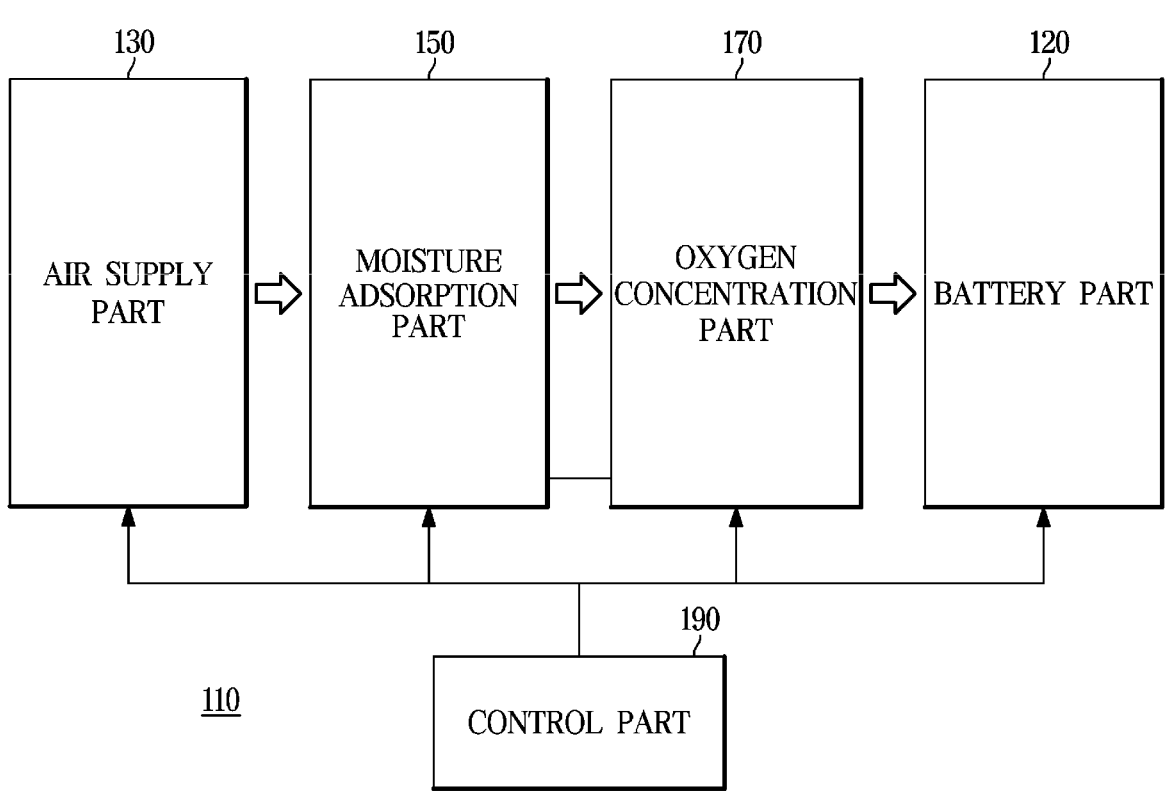
FIG. 1 is a block diagram illustrating a lithium-air battery based power supply device according to an embodiment.

Like reference numerals throughout the specification denote like elements. Also, this specification does not describe all the elements according to embodiments of the disclosure, and descriptions well-known in the art to which the disclosure pertains or overlapped portions are omitted.

It will be understood that when an element is referred to as being "connected" to another element, it can be directly or indirectly connected to the other element, wherein the indirect connection includes "connection" via a wireless communication network.

It will be understood that the term "include" when used in this specification specifies the presence of stated features, integers, steps, operations, elements, and/or components, but does not preclude the presence or addition of at least one other feature, integer, step, operation, element, component, and/or group thereof.

It is to be understood that the singular forms are intended to include the plural forms as well, unless the context clearly dictates otherwise.

The terms such as "part," "device," "block," "member", "module," and the like may refer to a unit for processing at least one function or act. For example, the terms may refer to at least process processed by at least one hardware, such as a field-programmable gate array (FPGA)/application specific integrated circuit (ASIC), software stored in memories or processors.

Reference numerals used for method steps are just used for convenience of explanation, but not to limit an order of the steps. Thus, unless the context clearly dictates otherwise, the written order may be practiced otherwise.

Hereinafter, embodiments of the disclosure will be described in detail with reference to the accompanying drawings.

FIG. 1 is a block diagram illustrating a lithium-air battery based power supply device according to an embodiment. The terms such as 'fault' used in the embodiments of the present disclosure are not intended to be used in a limited sense, but rather to indicate various abnormal operations of a power supply device 110.

Referring to FIG. 1, the power supply device 110 based on a lithium-air battery includes a battery part 120, an air supply part 130, a moisture adsorption part 150, an oxygen concentration part 170, and a control part 190.

The power supply device 110 based on a lithium-air battery is designed to supply power to relatively small environmentally friendly mobility devices and is composed of the lithium-air battery.

The air supply part 130 sucks external air and supplies it to the moisture adsorption part 150.

The moisture adsorption part 150 absorbs moisture contained in the air supplied by the air supply part 130.

The oxygen concentration part 170 extracts and concentrates the oxygen contained in the air.

The oxygen concentrated by the oxygen concentration part 170 is supplied to the battery part 120.

The control part 190 controls the overall operation of the battery part 120, the air supply part 130, the moisture adsorption part 150, and the oxygen concentration part 170 that are included the lithium-air battery based power supply device 110.

Figure 2:
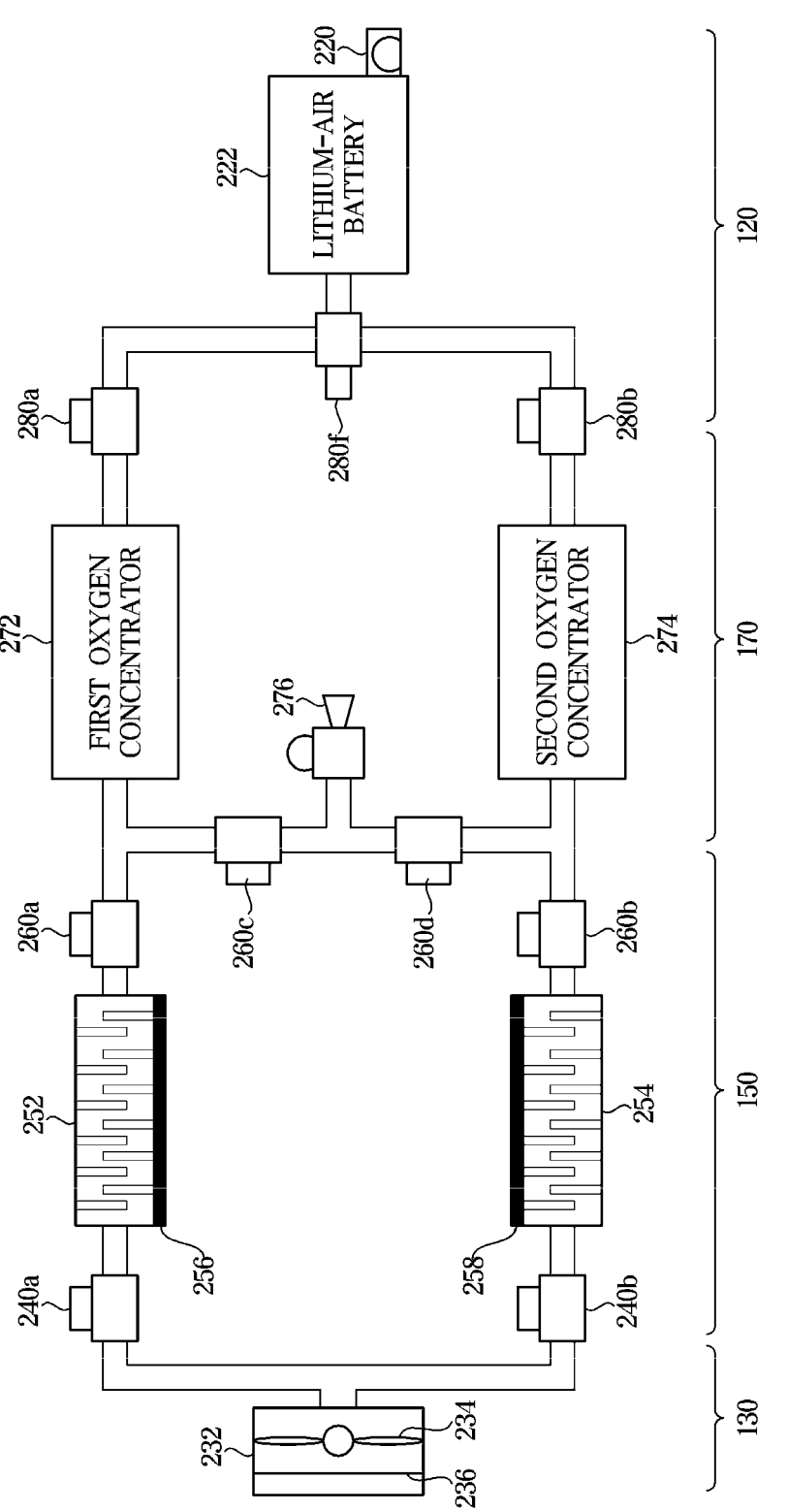
FIG. 2 is a view for illustrating a detailed configuration of the lithium-air battery based power supply device shown in FIG. 1.

FIG. 2 is a view for illustrating a detailed configuration of the lithium-air battery based power supply device shown in FIG. 1.

The air supply part 130 is equipped with an air pump 232 to suck external air and supply it to the moisture adsorption part 150.

In conventional power supply devices based on lithium-air batteries, a compressor was used to supply oxygen at a high concentration. However, in the exemplary embodiments of the present disclosure, a small and inexpensive air pump 232 is used instead of a compressor.

By using the air pump 232 instead of a compressor in the exemplary embodiments of the present disclosure, the power consumption of the air supply part 130 can be significantly reduced. In addition, since the air pump 232 has a smaller size compared to compressors, the overall size of the lithium-air battery based power supply device 110 can be reduced.

The air pump 232 may include a fan 234 and a dust filter 236. The fan 234 is designed to suck external air into the air pump 232. The dust filter 236 is designed to filter out dust from the air that is drawn into the air pump 232.

The moisture adsorption part 150 is designed to adsorb moisture from the air supplied from the air pump 232 of the air supply part 130.

By removing a significant portion of the moisture from the air in the moisture adsorption part 150, the efficiency of oxygen concentration in the oxygen concentration part 170 in the downstream can be greatly increased. To this end, the moisture adsorption part 150 is equipped with the first adsorption dehumidifier 252 and the second adsorption dehumidifier 254.

The first adsorption dehumidifier 252 and the second adsorption dehumidifier 254 each adsorb moisture from the air using 5A zeolite or MoF adsorbent. The saturation moisture adsorption capacity of the 5A zeolite used in the first adsorption dehumidifier 252 and the second adsorption dehumidifier 254 is approximately 20 to 30 WT %.

After regeneration involving heating according to an embodiment of the present disclosure, when performed for about 50 minutes, the moisture saturation of the first adsorption dehumidifier 252 and the second adsorption dehumidifier 254 can be reduced to less than 10 WT % from 30 WT %.

Also, through the regeneration process involving heating to about 100° C. according to the embodiment of the present disclosure for about 120 minutes, the saturated water vapor ratio of the first adsorption dehumidifier 252 and the second adsorption dehumidifier 254 can be reduced to 5 WT % or less.

As the regeneration frequency of the first adsorption dehumidifier 252 and the second adsorption dehumidifier 254 increases, the adsorption performance may deteriorate. Therefore, in the regeneration process of the moisture adsorption part 150 of the power supply device 110 based on a lithium-air battery according to an embodiment of the present disclosure, during the charging of the lithium-air battery 222, the first adsorption dehumidifier 252 and the second adsorption dehumidifier 254 are heated through the heating parts 256 and 258.

For this purpose, the first adsorption dehumidifier 252 and the second adsorption dehumidifier 254 each have a heating part 256 and 258 composed of a line heater or a heating tape.

In areas with high humidity, 3A zeolite can be used instead of 5A zeolite to increase the saturation moisture adsorption capacity up to about 35%.

At the rear end of the air pump 232, two air streams are branched off and connected to the first adsorption dehumidifier 252 and the second adsorption dehumidifier 254, respectively. In other words, one of the two air streams branched off from the rear end of the air pump 232 is connected to the first adsorption dehumidifier 252, and the other one is connected to the second adsorption dehumidifier 254.

A solenoid valve 240a is provided in the middle of the air duct connecting the rear end of the air pump 232 and the first adsorption dehumidifier 252. The flow of air from the air pump 232 to the first adsorption dehumidifier 252 can be controlled by opening and closing the solenoid valve 240a.

A solenoid valve 240b is provided in the middle of the air duct connecting the rear end of the air pump 232 and the second adsorption dehumidifier 254. The flow of air from the air pump 232 to the second adsorption dehumidifier 254 can be controlled by opening and closing the solenoid valve 240b.

The oxygen concentration part 170 includes the first oxygen concentrator 272, the second oxygen concentrator 274, and the vacuum pump 276. The suction ports of the first oxygen concentrator 272, the second oxygen concentrator 274, and the vacuum pump 276 are interconnected via multiple air ducts with the rear ends of the first adsorption dehumidifier 252 and the second adsorption dehumidifier 254.

A solenoid valve 260a is provided in the middle of the air flow path between the rear end of the first adsorption dehumidifier 252 and the first oxygen concentrator 272. The flow of air from the first adsorption dehumidifier 252 to the first oxygen concentrator 272 can be controlled by opening and closing the solenoid valve 260a.

A solenoid valve 260b is provided in the middle of the air flow between the rear end of the second adsorption dehumidifier 254 and the second oxygen concentrator 274. The flow of air from the second adsorption dehumidifier 254 to the second oxygen concentrator 274 can be controlled by opening and closing the solenoid valve 260b.

A solenoid valve 260c is installed in the middle of the air flow between the suction port of the first oxygen concentrator 272 and the suction port of the vacuum pump 276. The flow of air from the suction port of the first oxygen concentrator 272 to the suction port of the vacuum pump 276 can be controlled by opening and closing the solenoid valve 260c.

A solenoid valve 260d is installed in the middle of the air flow between the rear end of solenoid valve 260b, which is the suction port of the second oxygen concentrator 274, and the suction port of the vacuum pump 276. The flow of air from the rear end of solenoid valve 260b, which is the suction port of the second oxygen concentrator 274, to the suction port of the vacuum pump 276 can be controlled by opening and closing the solenoid valve 260d.

In an embodiment of the present disclosure, the vacuum pump 276 can be used in the oxygen concentration part 170 to increase the regeneration speed.

The vacuum pump 276 is connected between the suction port of the first oxygen concentrator 272 and the suction port of the second oxygen concentrator 274, and is configured to discharge the air from each of the first and second oxygen concentrators 272 and 274 to the outside.

When nitrogen is adsorbed in the first and second oxygen concentrators 272 and 274, the pressure of the air is pressurized to atmospheric pressure or a level of 4 bars. During regeneration, the pressure can be rapidly depressurized to near vacuum pressure by the action of the vacuum pump 276.

The rear end of the first oxygen concentrator 272, the rear end of the second oxygen concentrator 274, and the front end of the lithium-air battery 222 are interconnected through the air flow path.

Between the rear end of the first oxygen concentrator 272 and the suction port of the lithium-air battery 222, a solenoid valve 280a is provided in the middle of the air flow path. The flow of air from the rear end of the first oxygen concentrator 272 to the suction port of the lithium-air battery 222 can be controlled by opening and closing the solenoid valve 280a.

A solenoid valve 280b is provided in the middle of the air flow path between the rear end of the second oxygen concentrator 274 and the suction port of the lithium-air battery 222. The flow of air from the rear end of the second oxygen concentrator 274 to the suction port of the lithium-air battery 222 can be controlled by opening and closing the solenoid valve 280b.

The 4-way valve 280f is located in the flow path that connects the rear ends of the first oxygen concentrator 272 and the second oxygen concentrator 274, and the suction port of the lithium-air battery 222.

The 4-way valve 280f either directs the air flowing from the rear end of the first oxygen concentrator 272, through the solenoid valve 280a, to the suction port of the lithium-air battery 222 or directs the air flowing from the rear end of the second oxygen concentrator 274, through the solenoid valve 280b, to the suction port of the lithium-air battery 222. Additionally, the 4-way valve 280f directs the external air flowing into it to the first oxygen concentrator 272 and the second oxygen concentrator 274.

The 4-way valve 280f directs the external air to flow towards the first oxygen concentrator 272 and the second oxygen concentrator 274.

The battery part 120 can be in a sealed box form, and inside it, a lithium-air battery 222 is provided. Such a battery part 120 can also serve as an oxygen tank.

At the rear end of the lithium-air battery 222, a pressure higher than 0.3 bar (or 0.5 bar or more) than atmospheric pressure is maintained to facilitate the smooth discharge of reactants. Although not shown, this pressure regulation can be controlled by a pressure controller (such as a backpressure regulator) installed at the rear end of the lithium-air battery 222. In FIG. 2, reference symbol 220 represents a one-way valve."

Figure 3:
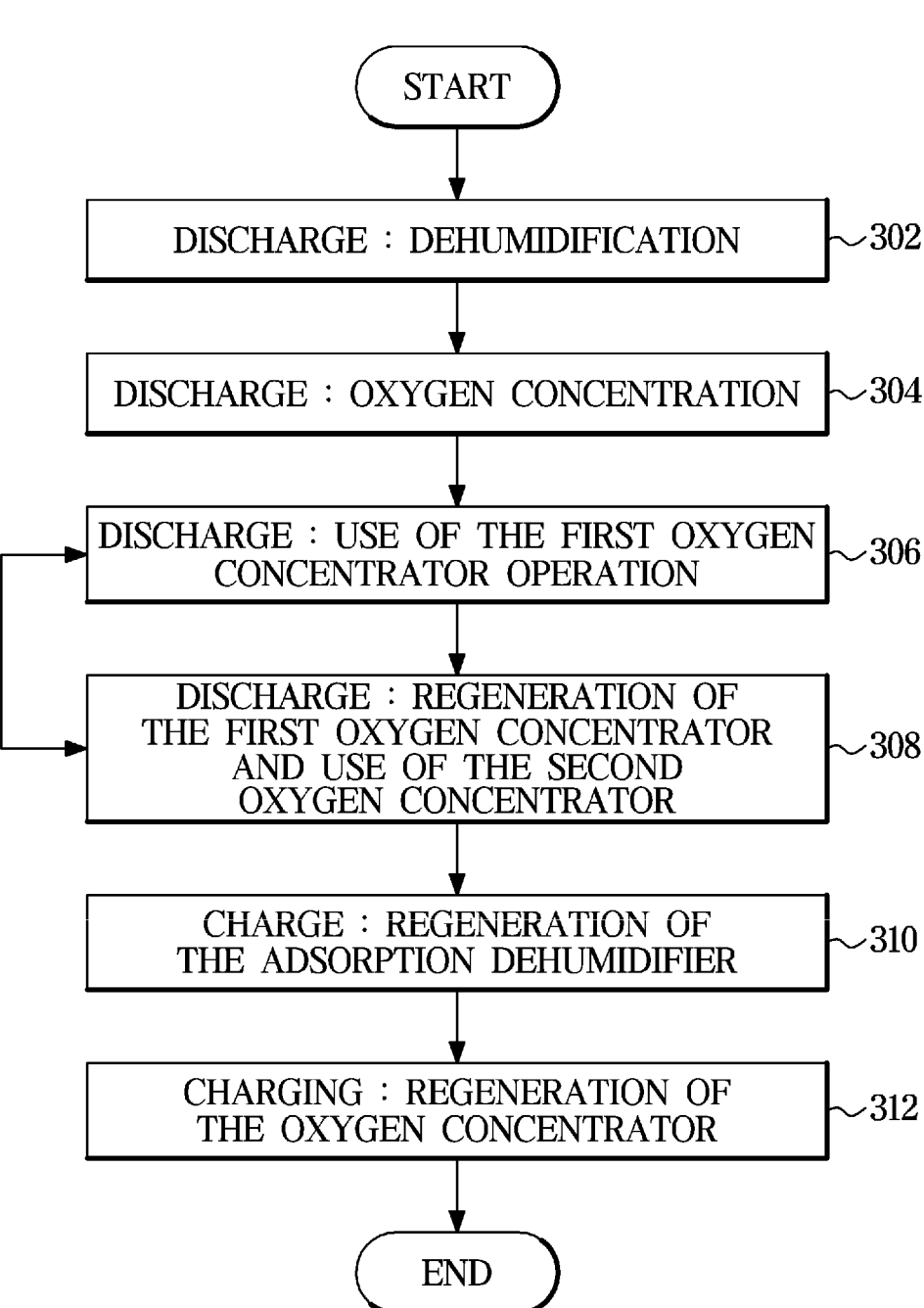
FIG. 3 is a flowchart illustrating a method of controlling a lithium-air battery based power supply device according to an embodiment.

FIG. 3 is a flowchart illustrating a control method for the lithium-air battery based power supply device according to an embodiment.

The control method of the lithium-air battery based power supply device shown in FIG. 3 can be performed by the power supply device 110.

The method of controlling the lithium-air battery based power supply device 110 according to an embodiment of the present disclosure includes processes of dehumidification 302, oxygen concentration 304, using the first oxygen concentrator 306, regenerating the first oxygen concentrator, using the second oxygen concentrator 308, regenerating the adsorption dehumidifier 310, and regenerating the oxygen concentrator 312.

Among these, dehumidification 302 and oxygen concentration 304, using the first oxygen concentrator 306, regenerating the first oxygen concentrator and using the second oxygen concentrator 308 are performed during the discharge of the lithium-air battery 222, while regenerating the adsorption dehumidifier 310 and regenerating the oxygen concentrator 312 are performed during the charging of the lithium-air battery 222.

During the process of "DISCHARGE: DEHUMIDIFICATION 302" performed during the discharge of the lithium-air battery 222, the solenoid valves 240a and 240b are opened by the control part 190, and the air pump 232 of the air supply part 130 is also operated. External air is then drawn into the lithium-air battery based power supply device 110 through the operated air pump 232.

The air taken in by the air pump 232 is supplied to the first adsorption dehumidifier 252 and the second adsorption dehumidifier 254 through the open solenoid valves 240a and 240b.

The air supplied to the first adsorption dehumidifier 252 and the second adsorption dehumidifier 254 undergoes dehumidification through the action of the 5A zeolite desiccant or MoF adsorbent in the first adsorption dehumidifier 252 and second adsorption dehumidifier 254, respectively, as it passes through each of them.

Next, the "DISCHARGE: OXYGEN CONCENTRATION 304" process during the discharge of the lithium-air battery 222 can be performed when the dehumidification action of the first adsorption dehumidifier 252 and the second adsorption dehumidifier 254 reaches a predetermined level.

In the oxygen concentration 304 process, solenoid valves 260a and 260b are additionally opened by control of the control part 190. As a result of the additional opening of the solenoid valves 260a and 260b, air dehumidified by the first adsorption dehumidifier 252 and the second adsorption dehumidifier 254 is supplied to the first oxygen concentrator 272 and the second oxygen concentrator 274.

At this time, the solenoid valves 260a and 260b located on the suction flow path of the first oxygen concentrator 272 and the second oxygen concentrator 274 are opened, while the solenoid valves 280a and 280b located on the exhaust flow path of the first oxygen concentrator 272 and the second oxygen concentrator 274 are closed.

In other words, with the solenoid valves 280a and 280b located on the exhaust flow path of the first oxygen concentrator 272 and the second oxygen concentrator 274 being closed, air is supplied to the first oxygen concentrator 272 and the second oxygen concentrator 274 through the solenoid valves 260a and 260b. Then, oxygen is extracted from the air and pressurized up to about 4 bar to concentrate the oxygen in the first oxygen concentrator 272 and the second oxygen concentrator 274. During the oxygen concentration process in the first oxygen concentrator 272 and the second oxygen concentrator 274, additional dehumidification can be carried out by the 13X zeolite in the first oxygen concentrator 272 and the second oxygen concentrator 274.

Next, the "DISCHARGE: USE OF THE FIRST OXYGEN CONCENTRATOR 306" performed during the discharge of the lithium-air battery 222 occurs when the oxygen concentration in the first oxygen concentrator 272 and the second oxygen concentrator 274 reaches a predetermined level.

During the "DISCHARGE: USE OF THE FIRST OXYGEN CONCENTRATOR 306" process, the solenoid valve 280*a* is additionally opened by the control of the control part 190. The solenoid valve 280*b* remains closed. By opening the solenoid valve 280*a* while the solenoid valve 280*b* is closed, oxygen concentrated to about 60% to 80% in the dehumidified first oxygen concentrator 272 can be supplied to the lithium-air battery 222.

To accomplish this, the control part 190 controls the flow path of the 4-way valve 280*f* to connect the rear end of the first oxygen concentrator 272 and the front end of the lithium-air battery 222. Additionally, the control part 190 closes the solenoid valve 240*b* when the solenoid valve 280*a* is opened to block the inflow of air to the second adsorption dehumidifier 254. The supply of oxygen from the first oxygen concentrator 272 to the lithium-air battery 222 continues until the oxygen partial pressure at the rear end of the first oxygen concentrator 272 drops below 40%.

Next, during the "DISCHARGE: REGENERATION OF THE FIRST OXYGEN CONCENTRATOR AND USE OF THE SECOND OXYGEN CONCENTRATOR 308" process performed during the discharge of the lithium-air battery 222, when the oxygen partial pressure at the rear end of the first oxygen concentrator 272 drops below 40%, the control part 190 closes the solenoid valves 240*a*, 260*a* and 280*a* to prevent the supply of oxygen to the lithium-air battery 222 through the first adsorption dehumidifier 252 and the first oxygen concentrator 272.

the control part 190 opens the solenoid valve 260*c* to discharge the air from the first oxygen concentrator 272 to the outside through the vacuum pump 276, enabling the regeneration of the first oxygen concentrator 272.

The control part 190 also opens the solenoid valves 240*b*, 260*b*, and 280*b* to supply lithium-air battery 222 with approximately 60% to 80% concentrated oxygen from the second oxygen concentrator 274.

For this purpose, the control part 190 controls the flow path of the 4-way valve 280*f* so that the rear end of the second oxygen concentrator 274 is connected to the front end of the lithium-air battery 222. The supply of oxygen from the second oxygen concentrator 274 to the lithium-air battery 222 continues until the oxygen partial pressure at the rear end of the second oxygen concentrator 274 drops below 40%.

When the oxygen partial pressure at the rear end of second oxygen concentrator 274 drops below 40%, the control part 190 repeats the supply of oxygen to the lithium-air battery 222 through the first oxygen concentrator 272 while performing the regeneration of the second oxygen concentrator 274.

In other words, the control part 190 alternates between using and regenerating (stripping) the first and second oxygen concentrators 272 and 274 in order to continuously supply concentrated oxygen to the lithium-air battery 222.

For example, the control part 190 ensures that the regenerated first oxygen concentrator 272 is regenerated when the regenerated second oxygen concentrator 274 is being used. Additionally, the control part 190 ensures that the regenerated second oxygen concentrator 274 is regenerated when the regenerated first oxygen concentrator 272 is being used.

Unlike during discharge of the lithium-air battery 222, the supply of concentrated oxygen to the lithium-air battery 222 is stopped during charging of the lithium-air battery 222. Instead, during charging of the lithium-air battery 222, the regeneration of the first adsorption dehumidifier 252, the second adsorption dehumidifier 254, the first oxygen concentrator 272, and the second oxygen concentrator 274 is performed.

For the "CHARGE: REGENERATION OF THE ADSORPTION DEHUMIDIFIER 310" performed during charging of the lithium-air battery 222, the control part 190 first closes the solenoid valves 280*a* and 280*b* to prevent the supply of concentrated oxygen to the lithium-air battery 222. In this state, the control part 190 opens all solenoid valves 240*a*, 260*a* and 260*c* around the first adsorption dehumidifier 252 and solenoid valves 240*b*, 260*b* and 260*d* around the second adsorption dehumidifier 254. This allows the air flowing through the air pump 232 to flow through the first adsorption dehumidifier 252 and the second adsorption dehumidifier 254 and through the vacuum pump 276.

The control part 190 also operates the heating parts 256 and 258 of the first adsorption dehumidifier 252 and the second adsorption dehumidifier 254, respectively, heating them for about 50 minutes to approximately 120 to 150° C. External power for charging the lithium-air battery 222 may be used to heat the heating parts 256 and 258. With about 50 minutes of regeneration involving heating according to an embodiment of the present disclosure, the moisture saturation ratio of the first adsorption dehumidifier 252 and the second adsorption dehumidifier 254 can be reduced to below 10 WT % from 30 WT %.

When regeneration involving heating to about 100° C. is performed for about 120 minutes according to an embodiment of the present disclosure, the ratio of saturated water vapor in the first adsorption dehumidifier 252 and the second adsorption dehumidifier 254 can be reduced to 5 WT % or less. The control part 190 can also perform regeneration for only one of the first adsorption dehumidifier 252 or the second adsorption dehumidifier 254 to perform additional regeneration. Due to this air flow, the first adsorption dehumidifier 252 and the second adsorption dehumidifier 254 can be regenerated while the lithium-air battery 222 is being charged.

For the "CHARGING: REGENERATION OF THE OXYGEN CONCENTRATOR 312" process during charging of the lithium-air battery 222, the control part 190 first opens the solenoid valves 280*a*, 260*c*, 280*b*, and 260*d* to allow the flow of air from the lithium-air battery 222 side to the vacuum pump 276 side.

To this end, the control part 190 closes solenoid valves 260*a* and 260*b* to prevent air flowing from the front of the first oxygen concentrator 272 and the second oxygen concentrator 274 into the first adsorption dehumidifier 252 and the second adsorption dehumidifier 254. Additionally, the control part 190 controls the flow of the 4-way valve 280*f* located on the suction side of the lithium-air battery 222 to allow external air to flow into the rear of the first and second oxygen concentrators 272 and 274.

Through this airflow, the first and second oxygen concentrators 272 and 274 can be regenerated using external air while the lithium-air battery 222 is being charged.

Figure 4:
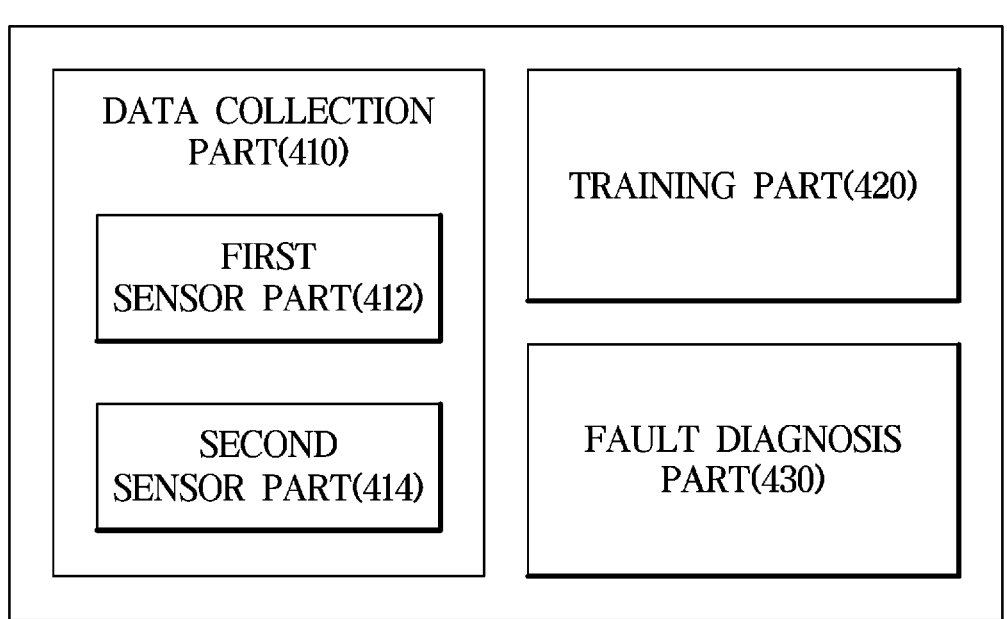
FIG. 4 is a block diagram illustrating an apparatus for diagnosing a fault of a lithium-air battery based power supply device according to an embodiment.

FIG. 4 is a block diagram illustrating an apparatus for diagnosing a fault of a lithium-air battery based power supply device according to an embodiment.

Referring to FIG. 4, the apparatus for diagnosing a fault 400 includes a data collection part 410, a training part 420 and a fault diagnosis part 430.

The data collection part 410 is configured to perform a test operation on a lithium-air battery based the power supply device 110 which includes an air supply part 130 including an air pump 232 for suctioning external air, a moisture adsorption part 150 for absorbing moisture in the air supplied from the air pump 232, an oxygen concentration part 170 for concentrating oxygen in the air supplied through the moisture adsorption part 150, and a battery part 120 for receiving the concentrated oxygen from the oxygen concentration part 170 at a time of discharge, and in response to a fault occurring in the air supply part 130, the moisture adsorption part 150, the oxygen concentration part 170, and the battery part 120, measure operational state changes of the air supply part 130, the moisture adsorption part 150, the oxygen concentration part 170, and the battery part 120 according to the types of the fault, to collect data.

The training part 420 is configured to train a neural network model by repeating a process of inputting residual changes according to the types of the fault into a neural network model as input values and classifying the types of the fault based on output values of the neural network model which are measurements of the operational state changes corresponding to the input values.

The fault diagnosis part 430 is configured to, during an actual operation of the lithium-air battery based power supply device 110, input residual changes of the air supply part 130, the moisture adsorption part 150, the oxygen concentration part 170, and the battery part 120 as input values for the trained neural network model, and diagnose a type of a fault based on output values output in response to the input values of the neural network model.

Here, the data collection part 410 includes a first sensor part 412 and a second sensor part 414.

The first sensor part 412 detects a fault at least one of solenoid valves 240a, 240b, 260a~260d, 280a and 280b, each respectively provided in an air routes connecting the air pump 232 to the moisture adsorption part 150, an air route connecting the moisture adsorption part 150 to the oxygen concentration part 170, an air route connecting the oxygen concentration part 170 to a vacuum pump 276 discharging air of the oxygen concentration part 170 to an outside, and an air route connecting the oxygen concentration part 170 to the battery part 120.

Although not shown, the first sensor part 412 may include sensors for detecting a normal opening and closing of the solenoid valves 240a, 240b, 260a~260d, 280a and 280b. Note that in the exemplary embodiment of the present disclosure, the terms "degradation" or "fault" are used interchangeably to refer to abnormal conditions of the components.

When the solenoid valves 240a, 240b, 260a~260d, 280a and 280b do not operate properly and do not open and close in time, it can affect the pressure and oxygen concentration of the oxygen concentrators 272 and 274. In other words, when the pressure and oxygen concentration of the oxygen concentrators 272 and 274 are not normal, it can be assumed that one or more of the solenoid valves 240a, 240b, 260a~260d, 280a and 280b have malfunctioned.

The second sensor part 414 detects a fault of at least one of the air pump 232, the first adsorption dehumidifier 252 and the second adsorption dehumidifier 254 included in the moisture absorption part 150, the heating part 256 and 258 for individually heating the first adsorption dehumidifier 252 and the second adsorption dehumidifier 254, the first oxygen concentrator 272 and the second oxygen concentrator 274 included in the oxygen concentration part 170, the vacuum pump 276, the lithium-air battery 222 included in the battery part 120, and a pressure regulator (not shown) for regulating an internal pressure of the battery part 120.

When a fault occurs in the air pump 232, a DC signal in response to the fault is transmitted to the air pump 232. Specifically, assuming that a DC signal corresponding to 20V is transmitted to the air pump 232 when it is in normal condition, a DC signal corresponding to 24V can be transmitted to the air pump 232 in the event of a fault. Accordingly, the second sensor part 414 may include one or more means for measuring the amount of increase in the DC signal transmitted to the air pump 232 and for measuring the voltage consumed by the air pump 232.

When a fault occurs in the air pump 232, the oxygen supply flow rate decreases, resulting in a change in the oxygen concentration and the amount of oxygen supplied to the lithium-air battery 222.

When the first adsorption dehumidifier 252 and the second adsorption dehumidifier 254 are degraded, they may not adsorb moisture properly from the air supplied from the air pump 232, resulting in a decrease in the oxygen concentration efficiency at the oxygen concentration part 170. Additionally, when air containing a large amount of moisture is supplied to the lithium-air battery 222 during charging and discharging operations, the voltage drop of the lithium-air battery 222 exceeds the threshold and the lifespan of the battery is shortened.

The second sensor part 414 may include means for measuring the humidity of the first adsorption dehumidifier 252 and the second adsorption dehumidifier 254, and means for measuring the time required to reach a specific humidity level during the regeneration process through the heating parts 256 and 258. Here, the means for measuring humidity may be provided at the front end of the air pump 232 and the lithium-air battery 222 to measure the humidity of the air or may measure the humidity of the air passing through moisture adsorption part 150, and determine whether it satisfies the standard.

When a fault occurs in the heating parts 256 and 258, the regeneration rate of the moisture adsorption part 150 may decrease. Therefore, the second sensor part 414 may include means for detecting the heating operation of the heating parts 256 and 258, which may be configured as a line heater or heating tape.

When the first oxygen concentrator 272 and the second oxygen concentrator 274 are degraded, the pressure of the oxygen concentrators 272 and 274 may decrease below a certain threshold, resulting in a decrease in oxygen concentration efficiency. Accordingly, the second sensor part 414 may include means for measuring oxygen concentration and means for measuring the pressure of the first oxygen concentrator 272 and the second oxygen concentrator 274.

When a fault occurs in the vacuum pump 276, the regeneration rate of the oxygen concentration part 170 decreases. Accordingly, the second sensor part 414 may include means for measuring the regeneration time through the vacuum pump 276.

Additionally, the second sensor part 414 may include means for measuring the voltage of the lithium-air battery 222.

At the rear end of the lithium-air battery 222, a pressure that is 0.3 to 0.5 bar higher than atmospheric pressure is maintained for smooth discharge of reaction products. The second sensor part 414 may include means for measuring the discharge pressure of the lithium-air battery 222, and through this, it can detect whether the pressure regulator that controls the internal pressure of the lithium-air battery 222 is malfunctioning.

Thus, each component that constitutes the power supply device 110 affects the air supply part 130, the moisture adsorption part 150, the oxygen concentration part 170, and the battery part 120, and when one or more components malfunction or degrade, characteristic results appear accordingly.

Based on the fault scenarios for each component that constitutes the power supply device 110 as shown in [Table 1] below, the power supply device 110 can be experimentally operated to collect data by measuring the operational state changes occurring in the air supply part 130, the moisture adsorption part 150, the oxygen concentration part 170, and the battery part 120 according to the type of fault that occurs for each component.

TABLE 1

| COMPONENT NAME (FAILURE CODE) | DETECTION METHODS |
| --- | --- |
| AIR PUMP (F1) | INCREASE IN PUMP SIGNAL |
| SOLENOID VALVE (F2) | PRESSURE AND CONCENTRATION OF OXYGEN CONCENTRATOR |
| ADSORPTION DEHUMIDIFIER (F3) | INCREASE IN HUMIDITY |
| HEATING PART (F4) | DECREASE IN REGENERATION RATE OF ADSORPTION DEHUMIDIFIER |
| OXYGEN CONCENTRATOR (F5) | DECREASE IN OXYGEN RATE |
| VACUUM PUMP (F6) | DECREASE IN REGENERATION RATE OF OXYGEN CONCENTRATOR |
| LITHIUM-AIR BATTERY (F7) | VOLTAGE DROP |
| PRESSURE REGULATOR (F8) | DECREASE IN EXHAUST PRESSURE |

Referring to [Table 1], the fault or degradation of each component comprising the power supply device 110 affects the operational status changes of the air supply part 130, the moisture adsorption part 150, the oxygen concentration part 170, and the battery part 120. By examining the operational status changes of the air supply part 130, the moisture adsorption part 150, the oxygen concentration part 170, and the battery part 120, it is possible to predict which component of the power supply device 110 has failed.

The data collected from the data collection part 410 can be used in the training process using the neural network model of the training part 420 and can be utilized for fault diagnosis.

Figure 5:
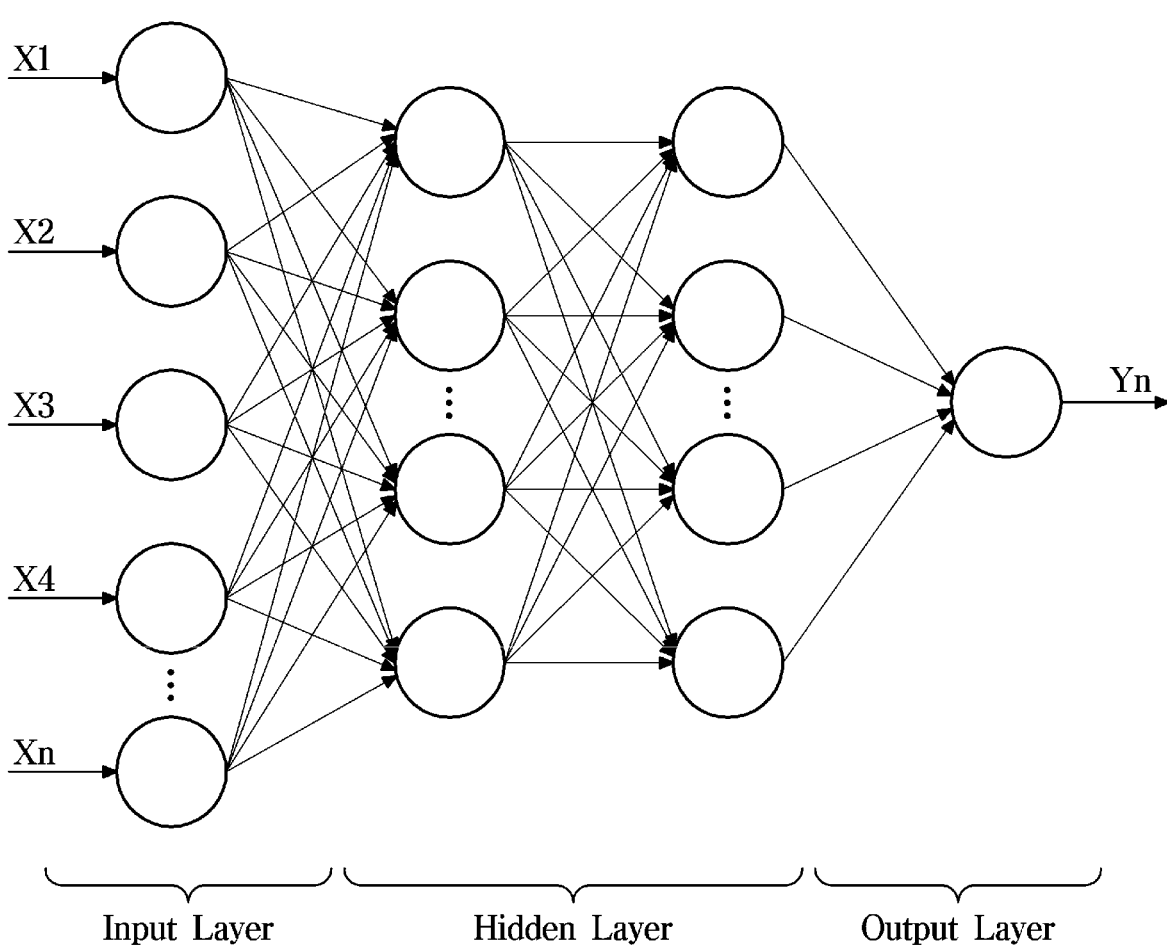
FIG. 5 is a view for illustrating a neural network model for learning of the apparatus for diagnosing a fault shown in FIG. 4.
Figure 6:
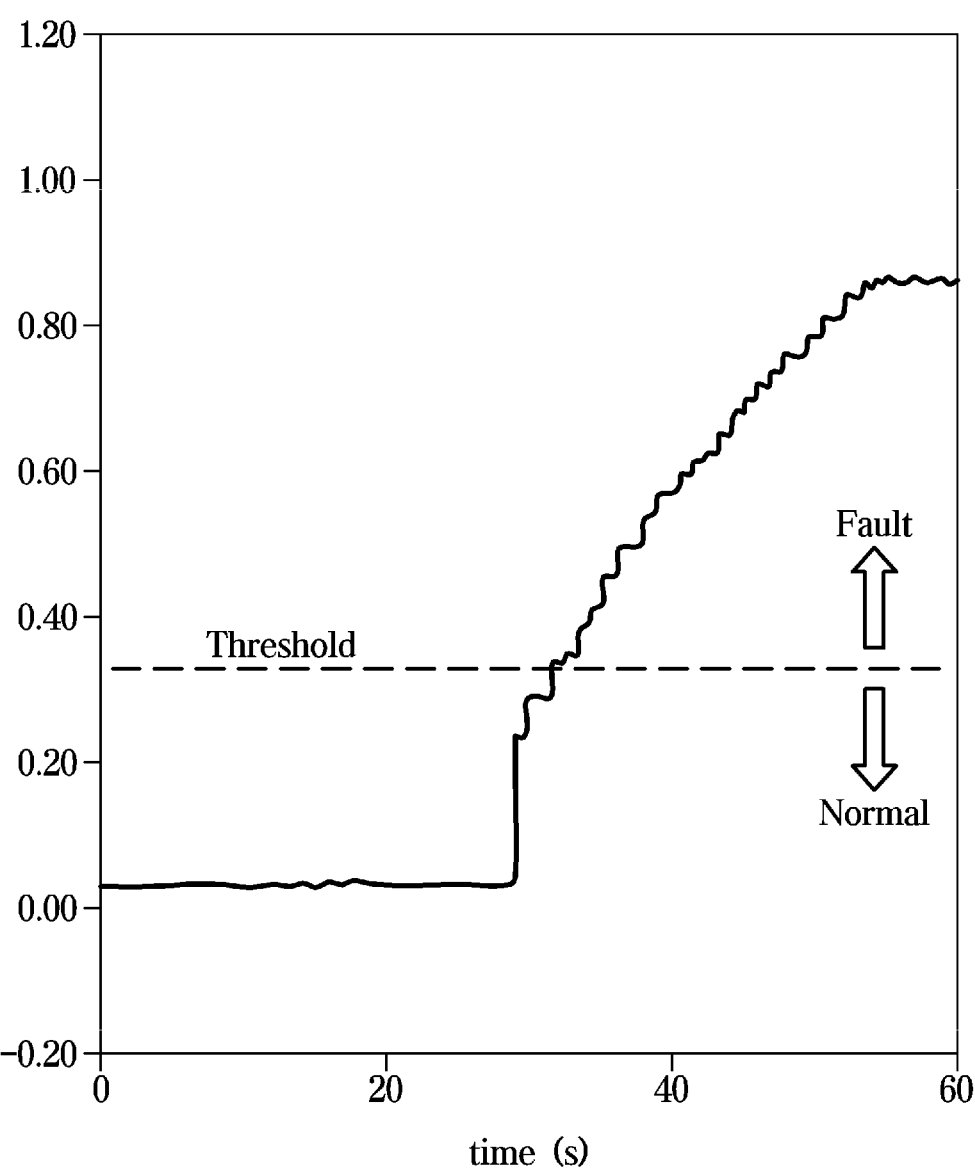
FIG. 6 is a graph showing the unique pattern of the output values depending on the type of a fault in response to the input values of the neural network model shown in FIG. 5.

FIG. 5 is a view for illustrating a neural network model for learning of the apparatus for diagnosing a fault shown in FIG. 4, and FIG. 6 is a graph showing the unique pattern of the output values depending on the type of a fault in response to the input values of the neural network model shown in FIG. 5. FIG. 7 is a view for illustrating the representation of the output values in the form of unique patterns of matrix values in response to the input values of the neural network model shown in FIG. 5.

Referring to FIG. 5, the neural network model according to an embodiment of the present disclosure can be composed of an input layer, a hidden layer, and an output layer.

In the Input Layer, residual changes according to the type of fault are input as input values. The residual changes between the predicted values in the normal state of each component of the power supply device 110 and the measured values in the event of a fault (or degradation) can be input as input values in the Input Layer.

For example, when a fault occurs in the air pump 232, a DC signal corresponding to the fault is transmitted to the air pump 232. Specifically, when the air pump 232 is in a normal state, a DC signal corresponding to 20V can be transmitted to the air pump 232 side. When a fault occurs, a DC signal corresponding to 24V can be transmitted to the air pump 232 side. When the air pump 232 fails, the oxygen supply flow rate decreases, resulting in changes in oxygen concentration and the amount of oxygen supplied to the lithium-air battery 222. The fault of the air pump 232 can be detected by utilizing the residual changes between the predicted DC signal in normal operation and the measured DC signal when a fault occurs in the air pump 232.

The residual change value (X1) of the air pump 232 is inputted into the input layer along with the residual change values (X2~Xn) of other components, such as solenoid valves and adsorption dehumidifiers mentioned in Table 1.

The training part 420 can represent residual changes in normalized data values between zero and 1 and can be converted into vector form to be inputted into the input layer as an input value.

The hidden layer receives input values from the input layer, calculates a weighted sum, and applies it to an activation function to be passed to the output layer.

At this time, the training part 420 can adjust the number of hidden layers, the number of nodes in the hidden layer, and variables of the optimization function to perform optimized learning.

The output layer outputs the measurement values of the power supply device 110's operating status changes in response to the input values of the input layer as the output values of the neural network model. Specifically, the output layer outputs the measurement values of the operating status changes occurring in the air supply part 130, moisture adsorption part 150, oxygen concentration part 170, and battery part 120 in the normal state as the output values of the neural network model corresponding to the input values of the input layer. In addition, the output layer outputs the measurement values of the operating status changes occurring in the air supply part 130, moisture adsorption part 150, oxygen concentration part 170, and battery part 120 according to the type of fault as the output values of the neural network model in response to the input values of the input layer.

For example, when a fault occurs in the air pump 232, it affects the operation and performance of the air supply part 130, the moisture adsorption part 150, the oxygen concentration part 170, and the battery part 120, and causes operational changes with characteristics related to a fault of the air pump 232.

As shown in FIG. 6, the unique patterns associated with a fault of the air pump 232 can be represented in graph form.

The X-axis represents time, and the Y-axis represents the unique pattern that increases in parts of set values. Parts that exceed the threshold value are classified as a fault and set to '1', while parts that do not exceed the threshold value are classified as normal and set to '-1'.

The training part 420 can express the output values of the neural network model as unique patterns of matrix values depending on the type of fault. The output values of the neural network model can be represented in matrix form, as shown in FIG. 7, and can indicate the type of fault, that is, whether a fault has occurred in a particular component.

Referring to FIG. 7 and Table 1 above, the matrix values for Fault_1 represent the unique pattern of the output values of the neural network model in response to a fault occurring in the air pump 232, with the second value exceeding the threshold and expressed as '1', indicating that the type of fault can be classified as a fault of the air pump 232. The matrix values for Fault_2 represent the unique pattern of the output values of the neural network model in response to a fault occurring in the solenoid valve, with the third value set to '1' indicating that there is a fault occurring in the solenoid valve. Similarly, Fault_3, Fault_4, etc. represent the unique pattern of the output values of the neural network model in response to a fault occurring in the each components.

The training part 420 can perform iterative learning for each fault using a neural network, such as a two-layer feedforward network with the backpropagation algorithm.

When the power supply device 110 is actually operated, the fault diagnosis part 430 inputs the residual changes of each component constituting the power supply device 110 as input values of the neural network model trained by the training part 420, and diagnoses the presence and type of faults based on the output values of the neural network model according to the input values.

Specifically, during the operation of the power supply device 110, the first sensor part 412 and the second sensor part 414 mentioned above measure the operation of each component of the power supply device 110. Then, the residual changes between the measured values and the predicted values under normal conditions are input as input values of the neural network model that has completed the training. Here, the residual changes can be represented as normalized data values between zero and 1, and can be converted into a residual vector to be input as input values of the neural network model. Even if there is a difference in the size of the residual between the training pattern and the actual pattern, fault diagnosis can be performed based on the most similar pattern.

The fault diagnosis part 430 can diagnose the presence and type of faults based on the output values of the neural network model according to the input values mentioned above.

For example, referring to FIG. 7, when the output value of the neural network model is a normal pattern, the fault diagnosis part 430 can diagnose that the operation state changes occurring in the air supply part 130, the moisture adsorption part 150, the oxygen concentration part 170, and the battery part 120 of the power supply device 110 are normal.

Also, when the pattern of Fault_3 is outputted, the fault diagnosis part 430 can diagnose that a fault has occurred in the adsorption dehumidifier.

Through the above-described examples, unique patterns corresponding to cases where multiple components as well as a single component are faulty (or degraded) are learned, and it is possible to predict which component has a fault occurred based on the output values of the neural network model during the actual operation of the power supply device 110."

The fault diagnosis part 430 can adjust the threshold values used to determine the presence and type of faults based on the output of the neural network model, allowing minor faults with minimal impact on the operation of the power supply device 110 to be treated as normal. This allows the device to continue to operate even if there are small changes in the desired oxygen concentration by adjusting the stiffness of the neural network. This adjustment of the neural network's stiffness through threshold value adjustment can also be performed during the aforementioned learning process.

FIG. 8 is a flowchart illustrating a method of diagnosing a fault of a lithium-air battery based power supply device using the apparatus for diagnosing a fault shown in FIG. 4.

Referring to FIG. 8, for diagnosing a fault of the lithium-air battery based power supply device 110, first, the power supply device 110 is performed a test operation, and data is collected by measuring the operational state changes in the air supply part 130, the moisture adsorption part 150, the oxygen concentration part 170, and the battery part 120 according to the type of fault that occurs for each component that makes up the power supply device 110 (S801)

The data collection process (S801) includes a step of detecting a fault in one or more solenoid valves 240a, 240b, 260a-260d, 280a and 280b arranged in each of the air routes. Here, each air route may include an air route connecting the air pump 232 to the moisture adsorption part 150, an air route connecting the moisture adsorption part 150 to the oxygen concentration part 170, an air route connecting the oxygen concentration part 170 to the vacuum pump 276 discharging air from the oxygen concentration part 170 to an outside, and an air route connecting the oxygen concentration part 170 to the battery part 120.

The data collection process (S801) includes a step of measuring operational state changes occurring in the air supply part 130, the moisture adsorption part 150, the oxygen concentration part 170, and the battery part 120 when a fault is detected.

The data collection process (S801) includes a process of detecting a fault in one or more of the heating parts 256 and 258, the first oxygen concentrator 272 and the second oxygen concentrator 274 included in the oxygen concentration part 170, the vacuum pump 276, the lithium-air battery 222 included in the battery part 120, and one or more pressure regulators (not shown) for controlling the internal pressure of the battery part 120. When a fault is detected, data can be collected by measuring the operational state changes that occur in the air supply part 130, the moisture adsorption part 150, the oxygen concentration part 170, and the battery part 120.

Next, the residual changes by the type of fault are inputted as input values to the neural network model, and the corresponding measurement values for operational state changes occurring in the air supply part 130, the moisture adsorption part 150, the oxygen concentration part 170, and the battery part 120 are used as output values for the neural network model. The process of classifying the type of fault from the output values is repeated (S811).

During the learning process (S811), the normalization of residual changes may be performed, which expresses the data values between zero and 1.

Additionally, during the learning process (S811), the output values of the neural network model can be represented by unique patterns of matrix values depending on the type of fault.

Next, during actual operation of the power supply device 110, the residual changes for each component that makes up the power supply device are inputted as input values to the neural network model, which has completed learning, and the type of fault is diagnosed based on the output values of the neural network model that correspond to the input values (S821).

The fault diagnosis process (S821) may include adjusting a threshold value that serves as the basis for determining the presence of a fault based on the output values of the neural network model. This allows a minor fault having an insignificant impact on the operation of the lithium-air battery based power supply device 110 to be treated as normal Embodiments of the disclosure have thus far been described with reference to the accompanying drawings. It should be apparent to those of ordinary skill in the art that the disclosure may be practiced in other forms than the embodiments as described above without changing the technical idea or essential features of the disclosure. The above embodiments are only by way of example, and should not be interpreted in a limited sense.

The invention claimed is:

1. An apparatus for diagnosing a fault of a lithium-air battery based power supply device, the apparatus comprising:

a data collection part configured to perform a test operation on a lithium-air battery based power supply device which comprises an air supply part, the air supply part comprising an air pump for suctioning external air, a moisture adsorption part for absorbing moisture in the air supplied from the air pump, an oxygen concentration part for concentrating oxygen in the air supplied through the moisture adsorption part, and a battery part for receiving the concentrated oxygen from the oxygen concentration part at a time of discharge, and in response to a fault occurring in the air supply part, the moisture adsorption part, the oxygen concentration part, and the battery part, measure operational state changes of the air supply part, the moisture adsorption part, the oxygen concentration part, and the battery part according to the types of the fault, to collect data;

a training part configured to train a neural network model by repeating a process of inputting residual changes according to the types of the fault into a neural network model as input values and classifying the types of the fault based on output values of the neural network model which are measurements of the operational state changes corresponding to the input values; and a fault diagnosis part configured to, during an actual operation of the lithium-air battery based power supply device, input residual changes of the air supply part, the moisture adsorption part, the oxygen concentration part, and the battery part as input values for the trained neural network model, and diagnose a type of a fault based on output values output in response to the input values of the neural network model;

wherein the data collection part comprises:

a first sensor part for detecting a fault of at least one solenoid valve provided in: (i) an air route connecting the air pump to the moisture absorption part, (ii) an air route connecting the moisture absorption part to the oxygen concentration part, (iii) an air route connecting the oxygen concentration part to a vacuum pump discharging air of the oxygen concentration part to an outside, or (iv) an air route connecting the oxygen concentration part to the battery part.

2. The apparatus of claim 1, wherein the data collection part is configured to collect data obtained by measuring the operational state changes occurring in the air supply part, the moisture absorption part, the oxygen concentration part, and the battery part in response to a fault being detected by the first sensor part.

3. The apparatus of claim 1, wherein the data collection part further comprises:

a second sensor part for detecting a fault of at least one of:
(i) the air pump, (ii) a first adsorption dehumidifier and a second adsorption dehumidifier included in the moisture absorption part, (iii) a heating part for individually heating the first adsorption dehumidifier and the second adsorption dehumidifier, (iv) a first oxygen concentrator and a second oxygen concentrator included in the oxygen concentration part, (v) the vacuum pump, (vi) a lithium-air battery included in the battery part, and (vii) a pressure regulator for regulating an internal pressure of the battery part, wherein the data collection part is configured to collect data obtained by measuring the operational state changes occurring in the air supply part, the moisture absorption part, the oxygen concentration part, and the battery part in response to a fault being detected by the second sensor.

4. The apparatus of claim 1, wherein the training part represents the residual changes using normalized data values between 0 and 1.

5. The apparatus of claim 1, wherein the training part represents the output values of the neural network model as a unique pattern of matrix values according to the type of the fault.

6. The apparatus of claim 1, wherein the fault diagnosis part adjusts a threshold value used for determining an occurrence of a fault based on the output values of the neural network model such that a minor fault having an insignificant impact on the operation of the lithium-air battery based power supply device is treated as normal.

7. A method for diagnosing a fault of a lithium-air battery based power supply device, the method comprising:

performing a test operation on a lithium-air battery based power supply device which comprises an air supply part comprising an air pump for suctioning external air, a moisture adsorption part for absorbing moisture in the air supplied from the air pump, an oxygen concentration part for concentrating oxygen in the air supplied through the moisture adsorption part, and a battery part for receiving the concentrated oxygen from the oxygen concentration part at a time of discharge;

collecting data, in response to a fault occurring in the air supply part, the moisture adsorption part, the oxygen concentration part, and the battery part, by measuring operational state changes of the air supply part, the moisture adsorption part, the oxygen concentration part, and the battery part according to the types of the fault;

training a neural network model by repeating a process of inputting residual changes according to the types of the fault into a neural network model as input values and classifying the types of the fault based on output values of the neural network model which are measurements of the operational state changes corresponding to the input values;

inputting residual changes of the air supply part, the moisture adsorption part, the oxygen concentration part, and the battery part, during an actual operation of the lithium-air battery based power supply device, as input values for the trained neural network model during an actual operation of the lithium-air battery based power supply device; and diagnosing a type of a fault based on output values output in response to the input values of the neural network model;

wherein collecting data comprises:

detecting, by a first sensor, a fault of at least one of solenoid valves respectively provided in an air route connecting the air pump to the moisture absorption part, an air route connecting the moisture absorption part to the oxygen concentration part, an air route connecting the oxygen concentration part to a vacuum pump discharging air of the oxygen concentration part to an outside, and an air route connecting the oxygen concentration part to the battery part.

8. The method of claim 7, wherein the collecting data comprises:

measuring the operational state changes occurring in the air supply part, the moisture absorption part, the oxygen concentration part, and the battery part in response to the fault detected by the first sensor.

9. The method of claim 7, wherein the collecting data further comprises:

detecting, by a second sensor, a fault of at least one of the air pump, a first adsorption dehumidifier and a second adsorption dehumidifier included in the moisture absorption part, a heating part for individually heating the first adsorption dehumidifier and the second adsorption dehumidifier, a first oxygen concentrator and a second oxygen concentrator included in the oxygen concentration part, the vacuum pump, a lithium-air battery included in the battery part, and a pressure regulator for regulating an internal pressure of the battery part; and measuring the operational state changes occurring in the air supply part, the moisture absorption part, the oxygen concentration part, and the battery part in response to the fault detected by the second sensor.

10. The method of claim 7, wherein the training the neural network model comprises:

representing the residual changes using normalized data values between 0 and 1.

11. The method of claim 7, wherein the training the neural network model comprises:

representing the output values of the neural network model as a unique pattern of matrix values according to the type of the fault.

12. The method of claim 7, wherein the diagnosing the type of fault comprises:

adjusting a threshold value used for determining an occurrence of a fault based on the output values of the neural network model such that a minor fault having an insignificant impact on the operation of the lithium-air battery based power supply device is treated as normal.

* * * * *